US012803533B2

(12) United States Patent
Brebels et al.

(10) Patent No.: US 12,803,533 B2
(45) Date of Patent: Nov. 17, 2026

(54) MULTISTAGE FEED NETWORK, SUPERCONDUCTING SYSTEM AND METHOD FOR FABRICATING SUPERCONDUCTING SYSTEM

(71) Applicant: IMEC VZW, Leuven (BE)

(72) Inventors: Steven Brebels, Heverlee (BE); Quentin Herr, Ellicot City, MD (US); Anna Herr, Ellicot City, MD (US)

(73) Assignee: IMEC VZW, Leuven (BE)

( * ) Notice: Subject to any disclaimer, the term of this patent is extended or adjusted under 35 U.S.C. 154(b) by 412 days.

(21) Appl. No.: 18/528,865

(22) Filed: Dec. 5, 2023

(65) Prior Publication Data

US 2025/0183877 A1 Jun. 5, 2025

(51) Int. Cl.

| | |
|---|---|
| ***H03H 11/02*** | (2006.01) |
| ***H10N 60/01*** | (2023.01) |
| ***H10N 60/80*** | (2023.01) |
| ***H10N 69/00*** | (2026.01) |

(52) U.S. Cl.

CPC ......... *H03H 11/02* (2013.01); *H10N 60/0912* (2023.02); *H10N 60/805* (2023.02); *H10N 69/00* (2023.02)

(58) Field of Classification Search

CPC .. H03H 11/02; H10N 60/0912; H10N 60/805; H10N 69/00; G06F 1/10; H01P 3/06; H03K 19/195; H03K 17/92

USPC .................................................. 327/527, 528

See application file for complete search history.

(56) References Cited

U.S. PATENT DOCUMENTS

2023/0208400 A1* 6/2023 Herr ..................... H10N 60/805 327/528

FOREIGN PATENT DOCUMENTS

WO WO-2016018430 A1 2/2016
WO WO-2023/122070 A1 6/2023

OTHER PUBLICATIONS

Herr, et al., "Scaling NbTiN-based ac-powered Josephson digital to 400M devices/cm[2]", dated May 2, 2023; arXiv:2303.16792v2 [physics.app-ph] Apr. 29, 2023, 7 pages.

International Search Report for Application No. PCT/EP2024/083852 mailed Mar. 21, 2025, 22 pages.

* cited by examiner

*Primary Examiner* — Regis J Betsch
*Assistant Examiner* — Amit R Bhatia
(74) *Attorney, Agent, or Firm* — MOSER TABOADA

(57) ABSTRACT

According to an aspect of the present inventive concept there is provided a multistage feed network for distributing a signal stage by stage for feeding a superconducting circuit. The multiple stages of the multistage feed network are arranged in a sequential order, and a plurality of two-port networks are configured to connect to two adjacent stages in between for impedance matching. At least one stage comprises a mesh network made of interconnected superconducting wires such that incoming signal(s) of said stage can be distributed to the outgoing signals of said stage by said mesh network with a minimal deviation of signal amplitude and of signal phase.

19 Claims, 4 Drawing Sheets

MULTISTAGE FEED NETWORK, SUPERCONDUCTING SYSTEM AND METHOD FOR FABRICATING SUPERCONDUCTING SYSTEM

TECHNICAL FIELD

The present description relates to a multistage feed network, a superconducting system comprising the multistage feed network, and a method for fabricating the superconducting system. In particular, the present description relates to a multistage feed network for distributing a signal for feeding a plurality of tiles of a superconducting circuit.

BACKGROUND

A superconducting circuit typically comprises superconducting wires and Josephson junctions that together form superconducting loops in which information in the form of a magnetic single flux quantum (SFQ) is encoded and stored.

The superconducting circuits can be configured to implement traditional logic gates such as AND gates, OR gates, Flip Flops, etc. These gates, in turn, can be configured to implement more complex logic such as shift registers, counters, processors, etc.

A superconducting system comprising superconducting circuits is capable of performing computing operations at a clock rate in excess of 100 GHz and is over 100 times more energy efficient than conventional electronic circuits. However, distributing signals, such as power signals and clock signals, to a large-scale superconducting circuit can be challenging.

Manufacturing superconducting systems is also difficult due to fabrication limitations related to power distribution, logic efficiency, and memory density.

Hence, there is a need for an improved superconducting circuit and an improved method for fabricating a superconducting circuit.

SUMMARY

An objective of the present description is to provide an improved multistage feed network for distributing signals for feeding a superconducting circuit. The multistage feed network can suppress parasitic modes, and maintain a uniform signal amplitude and/or a uniform signal phase for feeding the superconducting circuit.

Another objective of the present description is to provide a method for fabricating a superconducting system comprising a superconducting circuit including Josephson junction (s) and a multistage feed network, by forming Josephson junction(s) in some layers of a fabrication stack, while forming other parts of the superconducting circuit and the multistage feed network, in other layers of the fabrication stack. That is, the multistage feed network may be formed by using the existing resources (e.g., layers of the fabrication stack) for forming other parts of the superconducting circuit. This is advantageous not only for parameter targeting of the superconducting system but also for a simplified manufacturing of superconducting systems.

According to an aspect, there is provided a multistage feed network for distributing a signal for feeding a superconducting circuit. The multistage feed network comprises:

a number N stages being a first stage, . . . , and a Nth stage, arranged in a sequential order, and a plurality of two-port networks, each configured to electrically connect to two adjacent stages in between;

wherein the first stage is configured to electrically connect to a signal source for receiving a first incoming signal, and to distribute the first incoming signal to a plurality of first outgoing signals; . . . and wherein the Nth stage is configured to receive a plurality of Nth incoming signals, and to distribute each of the plurality of Nth incoming signals to a plurality of Nth outgoing signals;

wherein for each stage, except for the Nth stage, each of the plurality (pluralities) of outgoing signals of said stage is configured to be electrically coupled to one of the plurality of incoming signals of its immediate subsequent stage by one of the plurality of two-port networks;

wherein said one of the plurality of two-port networks is configured to perform impedance matching between said stage and its immediate subsequent stage;

wherein the pluralities of Nth outgoing signals are configured to be fed to the superconducting circuit;

wherein at least one stage of the number N stages comprises a mesh network made of interconnected superconducting wires such that the incoming signal(s) of said stage is configured to be distributed to the outgoing signals of said stage by said mesh network with a minimal deviation of signal amplitude and of signal phase;

wherein the signal source is an Alternating Current, AC, voltage source;

wherein the first incoming signal is a power/clock combined signal; and wherein N is an integer, and N≥2.

For example, the two-port network may comprise a first port and a second port; wherein a voltage across the first port is V1, a current flowing through a terminal of the first port is I1, a voltage across the second port is V2, a current flowing through a terminal of the second port is I2; wherein parameters A, B, C and D of the two-port network may be defined as:

$$\begin{bmatrix} V1 \\ I1 \end{bmatrix} = \begin{bmatrix} A & B \\ C & D \end{bmatrix} \begin{bmatrix} V2 \\ -I2 \end{bmatrix},$$

$$B = C = 0, \text{ and } D = 1/A.$$

The above example is an ideal two-port network. Practical implementations, e.g., by using superconducting materials, may be used to achieve a result close to the ideal two-port network.

The first incoming signal received from the AC voltage source may be used as a combined power/clock signal, which can be used to provide power and/or clock to a superconducting circuit.

The multistage feed network may be used for distributing a power signal and/or clock signal to the superconducting circuit.

Said one of the plurality of two-port networks may comprise at least one transmission line element having a length of one-half wavelength (λ/2).

The at least one transmission line element may comprise a single transmission line having a length of one-half wavelength (λ/2), or two transmission lines (i.e. a cascade of two transmission lines) connected in series each having a length of one quarter wavelength (λ/4).

The wavelength (λ) in the present description may refer to a wavelength of a signal transmitted through the transmission line(s).

A transmission line is a conductor designed to conduct an electromagnetic signal, when the conductor is long enough relatively to the wavelength of the signal such that the wave nature of the transmission must be taken into account. Transmission lines are widely used in the fields where the wavelengths of the transmitted signals are short, e.g., radio frequency (RF) engineering.

For the purposes of analysis, a transmission line can be modelled as a two-port network.

The at least one transmission line element may be implemented as a lumped element network comprising at least one inductor and at least one capacitor.

The Nth stage may comprise a bottom mesh network made of interconnected superconducting wires configured to feed the pluralities of Nth outgoing signals to the superconducting circuit.

The bottom mesh network may comprise multiple mesh network partitions split by one or more capacitors.

At least one of the one or more capacitors may be connected in series between every two adjacent mesh network partitions for splitting the bottom mesh network.

A capacitance of the at least one of the one or more capacitors may be selected to cause a resonance with inductors of said two adjacent mesh network partitions.

The first stage may comprise a top mesh network made of interconnected superconducting wires configured to electrically connect to multiple nodes for feeding the plurality of first outgoing signals to the second stage.

The first stage may comprise a transmission line element having a length of an integer multiple of one wavelength (λ) between any two electrically connected adjacent nodes of the multiple nodes.

Any stage of the number N stages, except for the first and the Nth stage, may comprise a mesh network made of interconnected superconducting wires configured to feed the pluralities of the outgoing signals of said stage to its immediate subsequent stage.

Said mesh network may comprise multiple mesh network partitions split by one or more capacitors.

At least one of the one or more capacitors may be connected in series between every two adjacent mesh network partitions for splitting said mesh network.

A capacitance of the at least one of the one or more capacitors may be selected to cause a resonance with inductors of said two adjacent mesh network partitions.

Any stage of the number N stages, except for the first and the Nth stage, may comprise a mesh network made of interconnected superconducting wires configured to electrically connect to multiple nodes for feeding the pluralities of the outgoing signals of said stage to its immediate subsequent stage.

Said stage may comprise a transmission line element having a length of an integer multiple of one wavelength (λ) between any two electrically connected adjacent nodes of the multiple nodes.

Said one of the plurality of two-port network may comprise a first matching network element and a second matching network element electrically connected in series between said stage and its immediate subsequent stage.

The first matching network element may comprise:

- a series capacitor comprising a first terminal electrically connected to said stage, and a second terminal electrically connected to the second matching network element, and
- a shunt inductor comprising a first terminal connected to the first terminal of the series capacitor, and a second terminal electrically connected to a ground or virtual ground node.

The second matching network element may comprise:

- a series inductor comprising a first terminal electrically connected to the second terminal of the series capacitor, and a second terminal electrically connected to said immediate subsequent stage, and
- a shunt capacitor comprising a first terminal connected to the second terminal of the series inductor, and a second terminal electrically connected to the ground or virtual ground node.

According to a second aspect, there is provided a superconducting system, comprising a superconducting circuit comprising a plurality of tiles. Each of the plurality of tiles comprises:

- at least one resonant circuit comprising:
  - an inductor comprising a first terminal and a second terminal, and
  - at least one capacitor comprising a first terminal electrically connected to the second terminal of the inductor; and
- at least one Josephson junction comprising a first terminal electrically connected to a second terminal of the at least one capacitor and a second terminal electrically connected to a ground or virtual ground node.

The superconducting system comprises the multistage feed network according to the first aspect configured to feed an outgoing signal of the pluralities of Nth outgoing signals to the terminal shared by the inductor and the at least one capacitor.

An inductance of the inductor and a capacitance of the at least one capacitor may be selected to cause the at least one resonant circuit to resonate at a frequency that substantially matches a particular frequency of said outgoing signal to facilitate switching a state of the at least one Josephson junction via a single flux quantum, SFQ, pulse.

The term "substantially" should be understood as a tolerance may exist between the frequency at which the at least one resonant circuit resonates and the particular frequency of said outgoing signal.

In other words, although the frequency at which the at least one resonant circuit resonates may not perfectly match the particular frequency, the tolerance may be tiny enough such that a matching can be considered to be achieved.

The tolerance may be 10%, preferably 5%, more preferably 2%, most preferably 1%, of the particular frequency.

According to a third aspect, there is provided a superconducting system, comprising a phase generator of a ring structure for generating multiple phase signals for feeding a superconducting circuit. The phase generator is configured to electrically connect to an AC voltage source such that a current flows through the ring structure in one direction;

- wherein the ring structure comprises:
  - a number M transmission line elements configured to electrically connect in series, each having a length of an integer multiple of one Mth wavelength (λ/M);
  - wherein a number M different phase signals are configured to output between two adjacent transmission line elements of the number M transmission lines, respectively;
- wherein the superconducting system comprises a number M multistage feed networks according to claim 1, each for feeding one of the number M different phase signals to the superconducting circuit;

wherein the wavelength (λ) is the wavelength of a signal transmitted through the transmission line elements;

wherein M is an integer, and M≥2.

At least one of the number M transmission line elements may be implemented as a lumped element network comprising at least one inductor and at least one capacitor.

The superconducting system may comprise the superconducting circuit. The superconducting circuit may comprise a plurality of tiles, each comprising:

at least one resonant circuit comprising:

an inductor comprising a first terminal and a second terminal, and at least one capacitor comprising a first terminal electrically connected to the second terminal of the inductor; and at least one Josephson junction comprising a first terminal electrically connected to a second terminal of the at least one capacitor and a second terminal electrically connected to a ground or virtual ground node;

where the number M multistage feed networks are configured to feed the number M different phase signals to the terminal shared by the inductor and the at least one capacitor, respectively.

According to a fourth aspect, there is provided a method for fabricating a superconducting system comprising:

a superconducting circuit comprising a plurality of tiles, each comprising at least one Josephson junction, and a multistage feed network for distributing a signal for feeding the superconducting circuit;

wherein the multistage feed network comprises a number N stages being a first stage, . . . , and a Nth stage, arranged in a sequential order, and a plurality of two-port networks, each configured to electrically connect to two adjacent stages in between.

The method comprises:

1) forming, in first layers of a fabrication stack, the multistage feed network and the plurality of tiles except for the at least one Josephson junction; and 2) forming, in second layers of the fabrication stack, the at least one Josephson junction;

wherein the first stage is configured to electrically connect to a signal source for receiving a first incoming signal, and to distribute the first incoming signal to a plurality of first outgoing signals; . . . and wherein the Nth stage is configured to receive a plurality of Nth incoming signals, and to distribute each of the plurality of Nth incoming signals to a plurality of Nth outgoing signals;

wherein for each stage, except for the Nth stage, each of the plurality (pluralities) of outgoing signals of said stage is configured to be electrically coupled to one of the plurality of incoming signals of its immediate subsequent stage by one of the plurality of two-port networks;

wherein said one of the plurality of two-port networks is configured to perform impedance matching between said stage and its immediate subsequent stage;

wherein the pluralities of Nth outgoing signals are configured to be fed to the superconducting circuit;

wherein at least one stage of the number N stages comprises a mesh network made of interconnected superconducting wires such that the incoming signal(s) of said stage is configured to be distributed to the outgoing signals of said stage by said mesh network with a minimal deviation of signal amplitude and of signal phase;

wherein the signal source is an Alternating Current, AC, voltage source;

wherein the first incoming signal is a power/clock combined signal; and wherein N is an integer, and N≥2.

The step of 1) forming, in first layers of a fabrication stack, the multistage feed network and the plurality of tiles except for the at least one Josephson junction may comprise:

forming, in the first layers of the fabrication stack, the plurality of tiles each comprising at least one resonant circuit comprising an inductor and at least one capacitor, wherein the inductor comprising a first terminal and a second terminal, and the at least one capacitor comprising a first terminal electrically connected to the second terminal of the inductor;

wherein the at least one Josephson junction comprises a first terminal electrically connected to a second terminal of the at least one capacitor and a second terminal electrically connected to a ground or virtual ground node.

The step of 1) forming, in first layers of a fabrication stack, the multistage feed network and the plurality of tiles except for the at least one Josephson junction may comprise:

forming at least two stages of the multistage feed network by interleaving two metal layers of the first layers.

According to a fifth aspect, there is provided a method for fabricating a superconducting system comprising a superconducting circuit comprising a plurality of tiles, each comprising at least one Josephson junction, and a phase generator comprising a ring structure for generating multiple phase signals for feeding the superconducting circuit;

wherein the phase generator is configured to electrically connect to an AC voltage source such that a current flows through the ring structure in one direction;

wherein the ring structure comprises:

a number M transmission line elements configured to electrically connect in series, each having a length of an integer multiple of one Mth wavelength (λ/M);

wherein a number M different phase signals are configured to output between two adjacent transmission line elements of the number M transmission lines, respectively;

wherein the superconducting system comprises a number M multistage feed networks according to claim 1, each for feeding one of the number M different phase signals to the superconducting circuit;

wherein the wavelength (λ) is the wavelength of a signal transmitted through the transmission line elements;

wherein M is an integer, and M≥2.

The method comprises:

forming, in first layers of a fabrication stack, the number M multistage feed networks, the phase generator, and the plurality of tiles except for the at least one Josephson junction; and forming, in second layers of the fabrication stack, the at least one Josephson junction.

The second, third, fourth and fifth aspects may generally present the same or corresponding advantages as the first aspect.

It is noted that the invention relates to all possible combinations of features recited in the claims.

BRIEF DESCRIPTION OF THE DRAWINGS

The above, as well as additional objects, features, and advantages of the present description, will be better understood through the following illustrative and non-limiting detailed description, with reference to the appended drawings. In the drawings like reference numerals will be used for like elements unless stated otherwise.

DETAILED DESCRIPTION

A superconducting circuit comprises superconducting wires formed from materials that can carry a direct current (DC) in the absence of an electric field. Such materials have almost zero resistance at or below their critical temperature. One example superconductor, niobium, has a critical temperature (Tc) of 9.3 Kelvin. At temperatures below the critical temperature, niobium is superconductive. However, at temperatures above the critical temperature, niobium behaves like a normal metal with electrical resistance.

A superconducting tile is an elemental circuit with materials that can conduct electricity with almost zero resistance when cooled below the critical temperature. Examples of superconducting materials include superconducting ceramics and superconducting metals.

The superconducting circuit comprises a plurality of tiles each comprising at least one Josephson junction. The Josephson junction typically comprises two superconductors coupled via a region that restricts the current. Examples of this region include or correspond to a physical narrowing of the superconductor itself, a metal region, or a thin insulating barrier. Some examples of Josephson junctions comprise niobium superconductors and an $Al_2O_3$ barrier therebetween. When a potential difference between the two superconductors is integrated with respect to time over one cycle of phase change, the magnetic flux through the loop changes by an integer multiple of a single quantum of magnetic flux. The voltage pulse associated with the single quantum of magnetic flux corresponds to a SFQ pulse. As an example, overdamped Josephson junctions can create individual SFQ pulses. In AC-SFQ circuits, each Josephson junction may be part of one or more superconducting loops. The phase difference across the Josephson junction may be modulated by the magnetic flux applied to the loop.

In connection with FIG. 1, the plurality of tiles 1 of a superconducting circuit will be discussed in detail.

Figure 1:
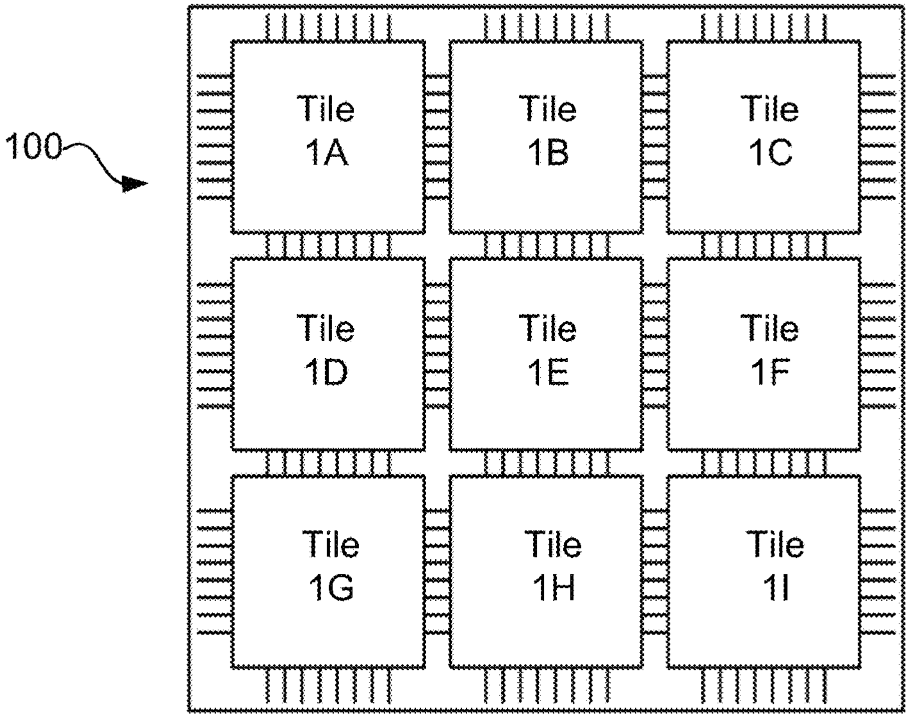
FIG. 1 is a schematic view of a plurality of tiles of an example superconducting circuit.

FIG. 1 illustrates nine tiles of a superconducting circuit 100. Any of these tiles 1A-1I may comprise one or more AC-SFQ circuits. The tiles 1A-1I (e.g., these AC-SFQ circuits) may be driven by signals fed by a multistage feed network 2 (shown in FIG. 2). The signals may be power signals, clock signals, or any other types of signals. The signal may be a combined signal providing both power and clock to the tiles 1.

For example, each tile 1A-1I may comprise at least one resonant circuit. The resonant circuit may be driven by a signal having a particular frequency and is configured to resonate at substantially the same frequency at which it is being driven.

The resonant frequencies of the resonant circuits of the plurality of tiles 1 may be substantially the same (e.g., 100 GHZ), but the phase may be different. The number of phases required relates to many factors, including but not limited to: the size of the pipeline of AC-SFQ circuits being driven by the resonant circuits, the frequency at which the AC-SFQ circuits are clocked, the size of the superconducting circuit, etc.

If eight phases are required, the phases of the resonant circuits of different tiles 1 may be spaced apart by 45°. For example, the phase of the resonant circuits of the first tile 1A is 0°, the phase of the resonant circuits of the second tile 1B is 45°, the phase of the resonant circuits of the third tile 1C is 90°, . . . .

If four phases are required, the phases of the resonant circuits of different tiles 1 may be spaced apart by 90°. For example, the phase of the resonant circuits of the first tile 1A is 0°, the phase of the resonant circuits of the second tile 1B is 90°, the phase of the resonant circuits of the third tile 1C is 180°, . . . .

Taking FIG. 1 as an example, if eight phases are used and the phase of the resonant circuits of the ninth tile 1I would be the same as the phase of the resonant circuits of the first tile 1A.

The superconducting circuit 100 may comprise multiple groups of tiles as illustrated in FIG. 1. The superconducting circuit 100 may comprise e.g., thousands, tens of thousands, hundreds of thousands, of tiles 1.

A feed network is needed for feeding signals to the large number of tiles 1. The feed network can be implemented as a resonant LC feed network. However, the performance of such resonant LC feed network is limited due to different reasons.

One reason is the parasitic higher order resonant modes. The frequency separation between wanted (ZOR) mode and higher order modes will decrease with an increasing size of the feed network. For a larger feed network size, wanted (ZOR) mode and unwanted modes overlap which will lead to amplitude and phase variations over the feed network.

Other reasons include the process parameter variations. A linear variation of the resonance frequency on a large feed network will lead to very large amplitude and phase variations over the feed network.

Other reasons also include parasitic capacitance. The resonant LC feed network has low voltage levels, but the feed network has significant voltages and is sensitive to parasitic capacitance that causes parasitic coupling to ground and between different phases of the feed network. The parasitic capacitance of the feed network further limits the $$\sqrt{\frac{L}{C}}$$

impedance of the matching network which severely limits the maximum obtainable feed impedance of the feed network.

Further, due to the phase variations mentioned in the above, generating and delivering multiple phase signals on-chip with an acceptable error in both phase and amplitude is challenging. Thus, an improved multistage feed network for distributing a signal for feeding a superconducting circuit is described in the present description.

In connection with FIG. 2, the multistage feed network 2 will be discussed in detail.

Figure 2:
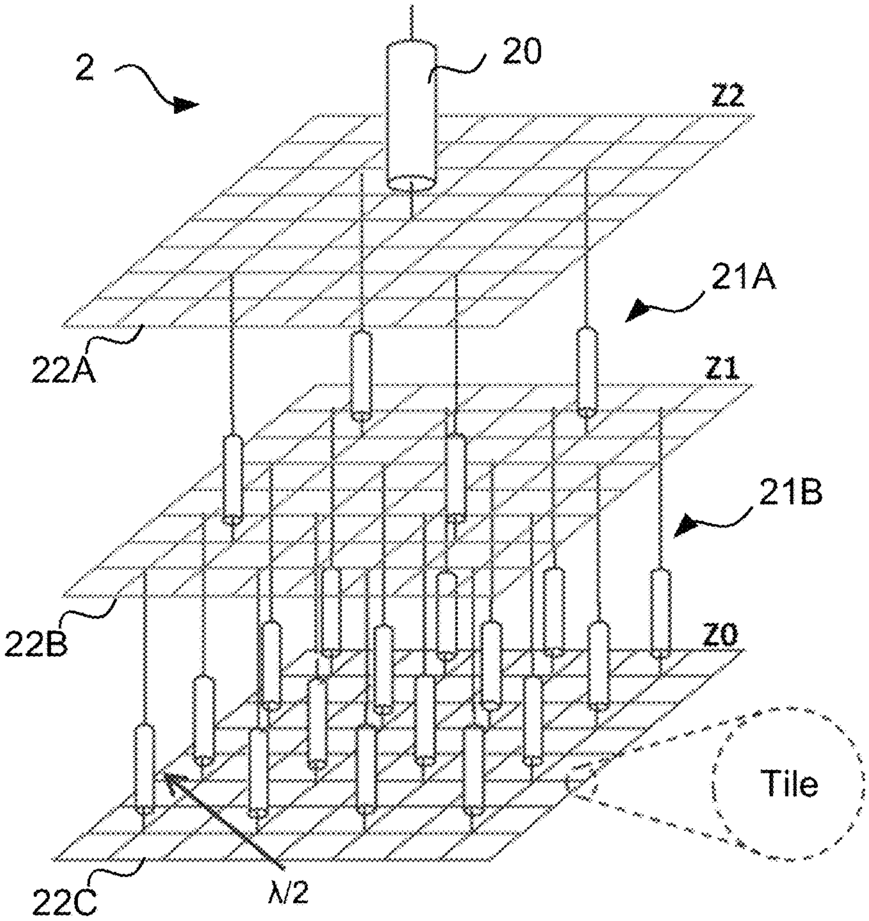
FIG. 2 is a schematic view of an example multistage feed network.

FIG. 2 illustrates a multistage feed network 2 comprising three stages: a first stage Z2, a second stage Z1, and a third stage Z0.

Hereinafter, the example multistage feed network used in the present description has three stages as shown in FIG. 2. However, the multistage feed network 2 may have any number N stages arranged in a sequential order. N is an integer and N≥2.

The multistage feed network 2 comprises at least two stages. Preferably, the multistage feed network 2 comprises at least three stages.

The multistage feed network 2 comprises a plurality of two-port networks 21, each configured to electrically connect to two adjacent stages in between. Each two-port network 21 is configured to perform impedance matching between the two stages that it is electrically connected to.

This is advantageous as the multistage feed network 2 may transform the very low impedance of the tiles 1 to the 50-ohm impedance at the signal source (not shown).

The first stage Z2 is configured to electrically connect to a signal source (not shown) for receiving a first incoming signal, and to distribute the first incoming signal to a plurality of first outgoing signals.

A two-port network 21A is configured to be provided in between and to electrically connect to the first stage Z2 and the second stage Z1.

The second stage Z1 is configured to receive a plurality of second incoming signals, and to distribute each of the plurality of second incoming signals to a plurality of second outgoing signals.

A two-port network 21B is configured to be provided in between and to electrically connect to the second stage Z1 and the third stage Z0.

The third stage Z0 is configured to receive a plurality of third incoming signals, and to distribute each of the plurality of third incoming signals to a plurality of third outgoing signals.

The pluralities of the third outgoing signals are configured to be fed to the superconducting circuit (the tiles 1).

A feed line 20 for feeding the signal from the signal source to the first stage Z2 is represented as a transmission line in FIG. 2.

The signal source is an Alternating Current (AC) voltage source. The first incoming signal received from the signal source is a combined power/clock signal. The combined signal may be used to provide both power and clock to the superconducting circuit.

At least one of the multiple stages Z2, Z1, Z0 comprises a mesh network made of interconnected superconducting wires such that the incoming signal(s) of said stage is configured to be distributed to the outgoing signals of said stage by said mesh network with a minimal deviation of signal amplitude and of signal phase.

For each stage except for the last stage (e.g., the first stage Z2 and the second stage Z1 in FIG. 2), each of the plurality (pluralities) of outgoing signals of said stage is configured to be electrically coupled to one of the plurality of incoming signals of its immediate subsequent stage by one of the plurality of two-port networks 21.

Each of the plurality of first outgoing signals of the first stage Z2 is configured to be electrically coupled to one of the plurality of the second incoming signals of the second stage Z1 by the two-port network 21A. That is, the plurality of first outgoing signals become the plurality of the second incoming signals after passing through the two-port network 21A. The plurality of first outgoing signals and the plurality of second incoming signals may have a one-to-one correspondence.

Each of the pluralities of second outgoing signals of the second stage Z1 is configured to be electrically coupled to one of the plurality of the third incoming signals of the third stage Z0 by the two-port network 21B. That is, the pluralities of second outgoing signals become the plurality of the third incoming signals after passing through the two-port network 21B. The pluralities of second outgoing signals and the plurality of third incoming signals may have a one-to-one correspondence.

In FIG. 2, each of the three stages Z2, Z1, Z0 comprises a mesh network 22A, 22B, 22C. Although the mesh networks 22A, 22B, 22C in FIG. 2 are illustrated to be the same, the mesh networks 22A, 22B, 22C should become denser and denser following the increased number of incoming and outgoing signals. The mesh networks 22A, 22B, 22C may also be different, e.g., in topology, etc.

The multistage feed network 2 can be considered as a "hierarchical" feed network which receives a source signal from the AC voltage source at a top stage (i.e. the first stage Z2), and further distributes the signal(s) in each stage for uniformly feeding the plurality of tiles 1. The deviations of signal amplitude and of signal phase between the outgoing signals can be minimized, or at least reduced.

The term "hierarchical" here refers merely to the flow of the signals from upstream (the signal source) to downstream (the tiles 1). The term "hierarchical" does not imply the relative positions or layers of a fabrication stack where the stages of the multistage feed network are formed. That is, the first, second, . . . and Nth stages do not need to be formed in a particular order in the fabrication stack.

The multistage feed network 2 may have a progressively increased impedance from the Nth stage to the first stage.

The multistage feed network 2 may be progressively sparser from the Nth stage to the first stage.

This is advantageous as the ZOR mode can be stabilized even when parameter gradients are present.

The two-port network 21 may comprise at least one transmission line element having a length of one-half wavelength (λ/2).

As an example, in FIG. 2, the two-port network 21A may comprise four transmission line elements each having a length of one-half wavelength (λ/2). The two-port network 21B may comprise sixteen transmission line elements each having a length of one-half wavelength (λ/2).

Each transmission line element may comprise a single transmission line having a length of one-half wavelength (λ/2), or two transmission lines connected in series (i.e. a cascade of two transmission lines) each having a length of one quarter wavelength (λ/4).

In the present description, the wavelength (λ) is the wavelength of a signal transmitted through the transmission line(s).

Any of the transmission lines may be implemented as a classical transmission line, as a miniaturized transmission line (e.g., using periodic inductive and/or capacitive loading), or as a lumped LC network.

In the present description, any transmission line element may be implemented as a lumped element network comprising at least one inductor and at least one capacitor.

A lumped element network may comprise only inductor(s) and capacitor(s) coupled together. In the present description, any transmission line element may be implemented as a lumped element network comprising only inductor(s) and capacitor(s) coupled together.

This is advantageous as all these implementations may be formed by using the available components (e.g., superconducting wires, inductors, and capacitors) already existing in the fabrication stack.

In connection with FIG. 8, an example two-port network 21 will be discussed in detail.

Figure 8:
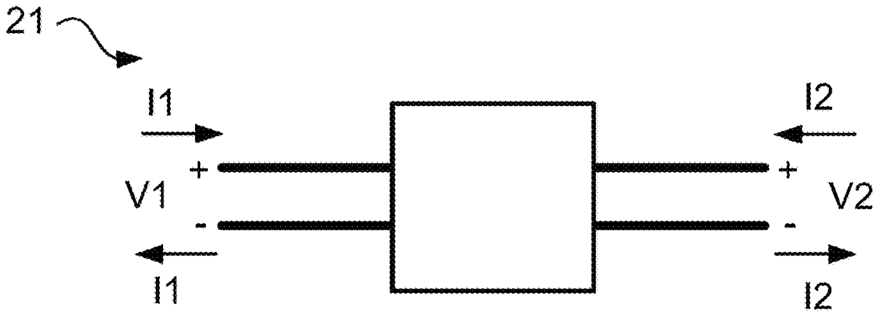
FIG. 8 is an example two-port network.

The two-port network 21 of FIG. 8 comprises a first port and a second port. Each port comprises two terminals +, −. A voltage across the two terminals of the first port is V1, and a current flowing through any one of the two terminals of the first port is I1. A voltage across the two terminals of the second port is V2, and a current flowing through any one of the two terminals of the second port is I2. The same current may flow into each port as may leave that port.

The two-port network 21 can be mathematically defined by using parameters A, B, C and D as:

$$\begin{bmatrix} V1 \\ I1 \end{bmatrix} = \begin{bmatrix} A & B \\ C & D \end{bmatrix} \begin{bmatrix} V2 \\ -I2 \end{bmatrix},$$

$$B = C = 0, \text{ and } D = 1/A.$$

The two-port network 21 can also be mathematically defined by using other parameters, such as z parameter, y parameter, etc.

FIG. 8 is merely an example two-port network 21. The two-port network 21 may be of other forms.

The last stage (i.e. the third stage Z0 in FIG. 2) may comprise a bottom mesh network 22C made of interconnected superconducting wires configured to feed the pluralities of third outgoing signals to the superconducting circuit (the tiles 1).

The bottom mesh 22C may be a mesh, e.g., a two-dimensional (2D) mesh as shown in FIG. 2, made of interconnected superconducting wires. With the bottom mesh 22C, the incoming signal(s) of the third stage Z0 may be distributed to the outgoing signals of the third stage Z0 with a minimal deviation of signal amplitude and of signal phase.

The first stage Z2 may comprise a top mesh network 22A made of interconnected superconducting wires configured to electrically connect to multiple nodes (not shown) for feeding the plurality of first outgoing signals to the second stage. Each node of the multiple nodes may be configured to electrically couple to at least two other nodes of the multiple nodes.

The first stage Z2 may comprise a transmission line element having a length of an integer multiple of one wavelength (λ) between any two electrically connected adjacent nodes of the multiple nodes.

This is advantageous as parasitic capacitance incorporated into the top mesh network 22A can be absorbed by the full-wavelength transmission line between the adjacent nodes. Thus, the two-port network 21A can be fed with signals of a same phase. It can guarantee a minimum amplitude variation even when there are significant parasitic capacitance and linear parameter variations. Thus, it can improve performance of the signal (power/clock signal) distribution over a large distance across a large-scale superconducting circuit.

Alternatively, or in combination, the top mesh network 22A may further comprise a transmission line having an integer multiple of one-half wavelength (λ/2) between at least some of the two electrically coupled nodes of the first mesh.

Nodes connecting to the transmission line having a length of an integer multiple of one-half wavelength (λ/2) may be interleaved with nodes connecting to the transmission line having a length of an integer multiple of one wavelength (λ), for feeding signals of an opposite phase to its immediate subsequent stage.

This may reduce by half the number of two-port networks needed between two stages. This may result in a lower total parasitic capacitance and less resource consumption for the routing layers. The transmission lines may be realized by any known ways, such as a classical transmission line, a miniaturized transmission lines (e.g., using periodic inductive and/or capacitive loading), or as lumped LC structures.

The "middle" stages, i.e. any stage of the number N stages except for the first and the Nth stage (e.g., the second stage Z1 in FIG. 2), may comprise a mesh network made of interconnected superconducting wires configured to electrically connect to multiple nodes for feeding the pluralities of the outgoing signals of said stage to its immediate subsequent stage.

Said "middle" stage may comprise a transmission line element having a length of an integer multiple of one wavelength (λ) between any two electrically connected adjacent nodes of the multiple nodes.

A superconducting system comprises a superconducting circuit comprising the plurality of tiles 1, and the multistage feed network 2. Each of the plurality of tiles 1 comprises at least one resonant circuit comprising an inductor comprising a first terminal and a second terminal, and at least one capacitor comprising a first terminal electrically connected to the second terminal of the inductor; and at least one Josephson junction comprising a first terminal electrically connected to a second terminal of the at least one capacitor and a second terminal electrically connected to a ground or virtual ground node. The multistage feed network 2 is configured to feed an outgoing signal of the pluralities of Nth outgoing signals to the terminal shared by the inductor and the at least one capacitor.

In connection with FIGS. 3A-3B, the tile 1 will be discussed in detail.

Figure 3A:
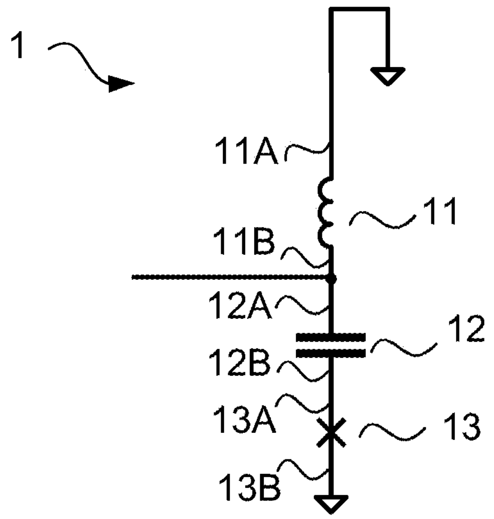
FIGS. 3A-3B are schematic diagrams of an example tile.

FIG. 3A illustrates a tile 1 comprising a resonant circuit and a Josephson junction 13. The resonant circuit comprises an inductor 11 comprising a first terminal 11A and a second terminal 11B, and a capacitor 12 comprising a first terminal 12A electrically coupled to the second terminal 11B of the inductor 11. The Josephson junction 13 comprises a first terminal 13A electrically coupled to a second terminal 12B of the capacitor 12 and a second terminal 13B electrically coupled to a common node. The common node may be a ground or a virtual ground.

The resonant circuit can bias the Josephson junction 13. A terminal shared by the inductor 11 and the capacitor 12 (i.e. the terminal connected to the first terminal 12A of the capacitor 12 and the second terminal 11B of the inductor 11) may be configured to receive a Nth outgoing signal from the Nth stage (e.g., the third stage Z0 in FIG. 2).

The terminal may be configured to be fed with the Nth outgoing signal via the Nth mesh network (e.g., the third mesh 22C in FIG. 2).

The AC voltage source (not shown) may be configured to output the first incoming signal having a particular magnitude, frequency, and phase. The first incoming signal may be distributed stage by stage into the Nth outgoing signals. Upon being driven by the Nth outgoing signal, the resonant circuit is configured to generate an AC signal that applies a bias voltage to the Josephson junction 13.

An inductance of the inductor 11 and a capacitance of the at least one capacitor 12 may be selected to cause the at least one resonant circuit to resonate at a frequency that substantially matches a particular frequency of the Nth outgoing signal to facilitate switching a state (e.g., advancing the superconductor phase) of the at least one Josephson junction 13, e.g., via a single flux quantum, SFQ, pulse.

For example, the inductance of the inductor 11 and the capacitance of the capacitor 12 of the resonant circuit may be selected to satisfy the expression:

$$f = \frac{1}{2\pi\sqrt{LC}}$$

where f is the resonant frequency, L is the inductance of the inductor 11, and C is the capacitance of the capacitor 12.

The values of the output impedance and magnitude of the AC voltage source, the inductance of the inductor 11, etc., may be selected based and/or may depend on various parameters.

Figure 3B:
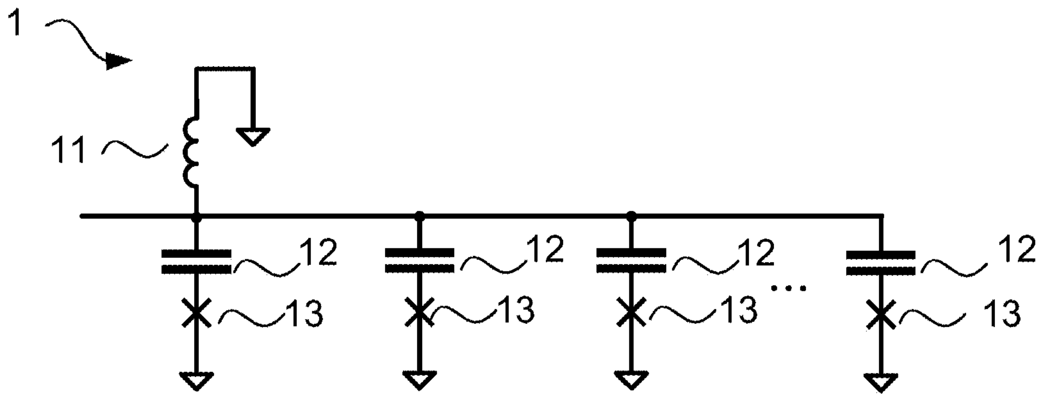

FIG. 3B illustrates a different example of the tile 1. The example of FIG. 3B is similar to that of FIG. 3A except for that it comprises multiple Josephson junctions 13. The resonant circuit of FIG. 3B comprises an inductor 11 and a plurality of capacitors 12 electrically coupled to the second terminal of the inductor 11. Each of the multiple Josephson junction 13 is electrically coupled to one of the plurality of capacitors 12.

The resonant circuit of FIG. 3B can bias the multiple Josephson junctions 13.

The inductance of the inductor 11 scales inversely with the number of the plurality of capacitors 12. In particular, the inductance of the inductor 11 and the capacitances of the plurality of capacitors 12 are selected to satisfy the expression:

$$f = \frac{1}{2\pi\sqrt{LAC}}$$

where f is the resonant frequency, L is the inductance of the inductor 11, C is the capacitance of each of the plurality of capacitors 12, and A corresponds to the number of the plurality of capacitors 12, which in some examples corresponds to the number of the multiple Josephson junctions 13.

Figure 7:
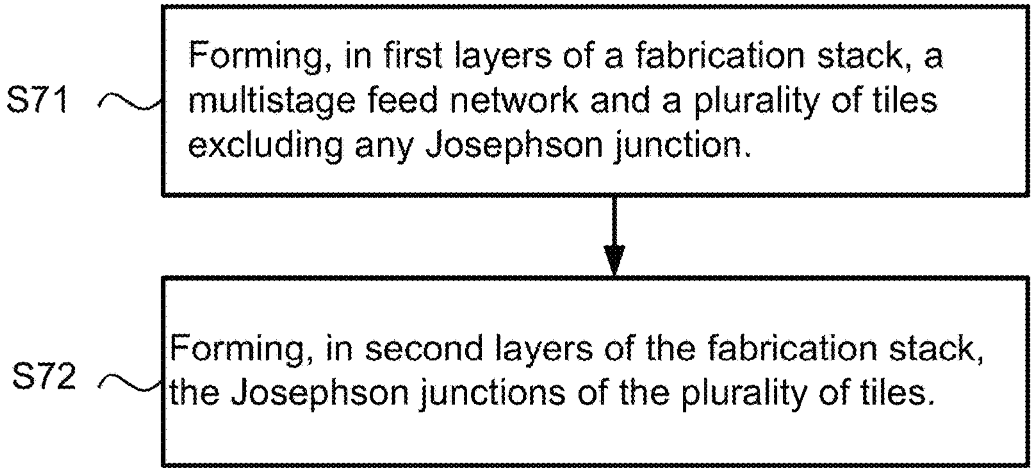
FIG. 7 is a flow chart of method steps for fabricating an example superconducting system.

After discussing the superconducting system, the method for fabricating the superconducting system will be discuss in detail in connection with FIG. 7.

The method for fabricating the superconducting system comprises: forming, in the first layers of a fabrication stack, the multistage feed network 2 and the plurality of tiles 1 except for the at least one Josephson junction 13 (S71); and forming, in second layers of the fabrication stack, the at least one Josephson junction 13 (S72).

This is advantageous as the multistage feed network 2 may be formed in the same layers of the fabrication stack for forming the tiles 1 except for the Josephson junctions 13.

The other features relating to the multistage feed network 2 described in the present description, e.g., the two-port network 21 for performing impedance matching, may be generally applicable to the method for fabricating the superconducting system.

The step (S71) of forming, in first layers of a fabrication stack, the multistage feed network 2 and the plurality of tiles 1 except for the at least one Josephson junction 13 may comprise:

forming, in the first layers of the fabrication stack, the plurality of tiles 1 each comprising at least one resonant circuit comprising an inductor 11 and at least one capacitor 12, wherein the inductor 11 comprising a first terminal 11A and a second terminal 11B, and the at least one capacitor 12 comprising a first terminal 12A electrically connected to the second terminal 11B of the inductor 11.

The at least one Josephson junction 13 may comprise a first terminal 13A electrically connected to a second terminal 12B of the at least one capacitor 12 and a second terminal 13B electrically connected to a ground or virtual ground node.

The step (S71) forming, in first layers of a fabrication stack, the multistage feed network 2 and the plurality of tiles 1 except for the at least one Josephson junction 13 may comprise:

forming at least two stages of the multistage feed network 2 by interleaving two metal layers of the first layers.

The fabrication stack comprising layers for forming the superconducting system will be discussed in detail.

The fabrication stack comprises first layers where the multistage feed network 2 and the tiles 1 except for the Josephson junctions 13 are formed.

That is, the resonant circuit(s), including the inductor(s) 11 and the capacitor(s) 12 may be formed in the first layers.

The first layers may comprise one or more inductor layers and one or more capacitor layers in which inductors 11 and capacitors 12 are respectively formed.

The first layers may comprise a ground layer (e.g., a ground plane) below each of the one or more capacitor layers to provide isolation.

The first layers may comprise a conductive interconnect layer where the one or more mesh networks are formed.

The superconducting circuit fabrication stack comprises second layers where the Josephson junctions 13 are formed.

The area of a particular tile on one of the first layers may be determined either by the area of its capacitor(s) 12 or the area of its inductor(s) 11. The area of a particular tile 1 may be made to match the area of its Josephson junctions 13.

For example, one hundred Josephson junctions having an average critical current, $I_c$, of 50 μA at a critical current density of $$J_C = 100\frac{kA}{\text{cm}^2}$$

may occupy a 5×5 $\mu m^2$ area, which can accommodate one hundred capacitors, but may only accommodate one inductor.

For instance, for the same frequency, bias current, quality factor Q, and capacitance requirements used in the tile 1 of FIG. 3A, the inductance of the inductor 11 in the tile example of FIG. 3B is much smaller. Consequently, fabrication of the inductor 11 of FIG. 3B takes up less space (e.g., two-dimensional area and/or three-dimensional volume) than the inductor 11 of FIG. 3A by virtue of its inductance being much smaller.

The capacitors 12 may be implemented as Metal-Insulator-Metal (MIM) structures comprising a high-K dielectric and high kinetic inductance electrodes (e.g., NbTiN electrodes). The MIM capacitors may be sized to provide a bias current, $I_b$, to the Josephson junction given by b $I_b/I_c \approx 0.75$. The target capacitance for the 35 μA Josephson junction is 2.6 fF and scales linearly with the Josephson junction size.

In some examples of the MIM capacitors, the dielectric comprises $HfO_x(Si)$, which has a high dielectric constant, k, and which facilitates tuning of the capacitance via an applied DC voltage. In an example, the area of the smallest capacitor is 0.1 $\mu m^2$ which corresponds to a capacitor having a dielectric constant k of 32 and a 10 nm thickness. In some examples, the MIM capacitors have NbTiN electrodes.

In connection with FIG. 4, the bottom mesh network 22N of the Nth stage will be discussed in detail.

The bottom mesh network 22N may comprise multiple mesh network partitions split by one or more capacitors $C_s$. At least one of the one or more capacitors $C_s$ may be connected in series between every two adjacent mesh network partitions for splitting the bottom mesh network 22N.

Figure 4:
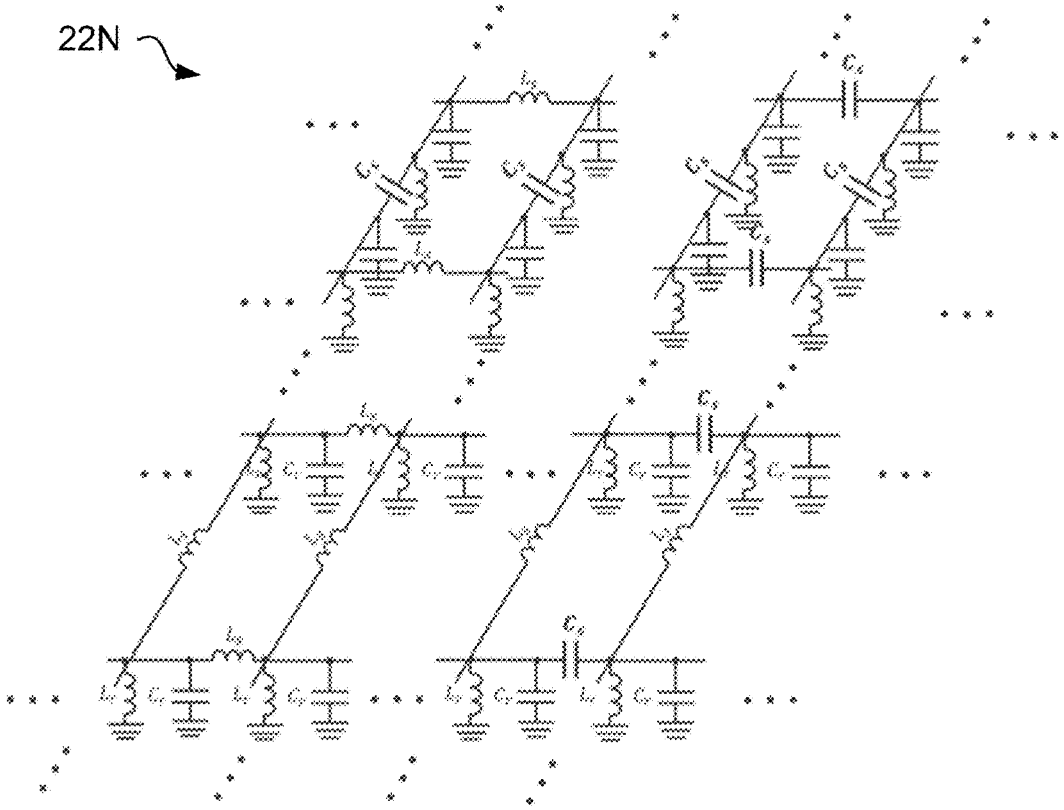
FIG. 4 is a schematic diagram of an example mesh network.

In FIG. 4, only the resonant circuits (represented by the inductors $L_r$ and the capacitors $C_r$) of the tiles 1 are shown. Inductors $L_s$ in FIG. 4 are the series inductance. The Josephson junctions 13 of the tiles 1 are not illustrated in FIG. 4.

By providing the capacitor(s) $C_s$, the amplitude variations of the pluralities of Nth outgoing signals for feeding the tiles 1 can be reduced across the superconducting circuit as each partition of the bottom mesh network 22N can be individually biased and tuned to different resonant frequencies.

For example, the capacitance of the capacitors $C_s$ can be selected to compensate the amplitude variations even when no tuning is applied on the capacitors $C_r$ of the resonant circuits of the tiles 1.

A capacitance of the at least one of the one or more capacitors $C_s$ may be selected to cause a resonance with inductors $L_r$ of said two adjacent mesh network partitions.

The "middle" stages, i.e. any stage of the number N stages except for the first and the Nth stage (e.g., the second stage Z1) may comprise a mesh network made of interconnected superconducting wires configured to feed the pluralities of the outgoing signals of said stage to its immediate subsequent stage.

Similar to the bottom mesh network 22N as shown in FIG. 4, said mesh network of the "middle" stages may comprise multiple mesh network partitions split by one or more capacitors; and at least one of the one or more capacitors may be connected in series between every two adjacent mesh network partitions for splitting said mesh network.

A capacitance of the at least one of the one or more capacitors may be selected to cause a resonance with inductors of said two adjacent mesh network partitions.

It is advantageous as said capacitor(s) may reduce the amplitude variations of the pluralities of outgoing signals of said stage for feeding to its immediate subsequent stage, as each partition can be individually biased and tuned to different resonant frequencies.

Figure 5A:
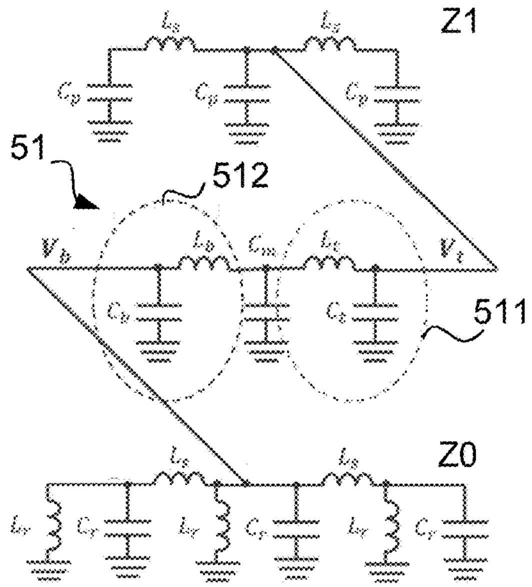
FIG. 5A is a schematic diagram of a prior art two-port network.

FIG. 5A is a schematic diagram of a prior art two-port network 51. The two-port network 51 comprises two sections: a bottom section 512 and a top section 511, electrically connected in series between two networks, e.g., two stages Z0, Z1 of a feed network.

Each section 511, 512 comprises an inductor and a capacitor. In the bottom section 512, a capacitor $C_b$ and an inductor $L_b$ form a resonant low-pass network at a resonance frequency or, wherein $$\omega_r^2 L_b C_b = 1.$$

In the top section 511, a capacitor $C_t$ and an inductor $L_t$ form a similar resonant low-pass network.

In FIG. 5A, $V_b$ and $V_t$ are the voltages across the two ports of the two-port network 51. $V_t$ is the voltage of the port connected to the stage Z1, and $V_b$ is the voltage of the port connected to its subsequent stage, the stage Z0.

In FIG. 5A, only the resonant circuits (the inductors $L_r$ and the capacitors $C_r$) of the tiles 1 are illustrated. The Josephson junctions 13 of the tiles 1 are not shown in FIG. 5A. The series inductance is represented as the inductors $L_s$, and the parasitic capacitance is represented as the capacitors $C_p$ in FIG. 5A.

The impedance transformation of the two-port network 51 can be calculated as a voltage ratio $$\left|\frac{V_t}{V_b}\right|.$$

This ratio is equal to $$\frac{1}{\omega_r^2 (C_t + C_p) L_b}.$$

Thus, the parasitic capacitance $C_p$ of the stage Z1 limits the voltage ratio.

In connection with FIG. 5B, the two-port network 21 of the multistage feed network 2 will be discussed in detail.

Figure 5B:
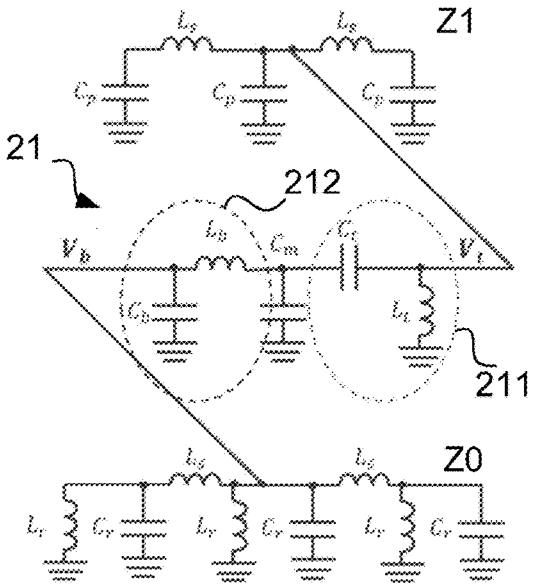
FIG. 5B is a schematic diagram of an example two-port network.

Similar to the two-port network 51 of FIG. 5A, the two-port network 21 of FIG. 5B comprises a first matching network element 211 and a second matching network element 212 electrically connected in series between one stage (any of the first stage to the (N−1)th stage) and its immediate subsequent stage. In FIG. 5B, the stages Z1 and Z0 are used as example stages that the two-port network 21 is connected to.

Similarly to FIG. 5A, $V_b$ and $V_t$ are the voltages across the two ports of the two-port network 21. In FIG. 5B, $V_t$ is the voltage of the port connected to the stage Z1, and $V_b$ is the voltage of the port connected to its subsequent stage, the stage Z0.

In FIG. 5B, only the resonant circuits (the inductors $L_r$ and the capacitors $C_r$) of the tiles 1 are illustrated. The Josephson junctions 13 of the tiles 1 are not shown in FIG. 5B. The series inductance is represented as the inductors $L_s$, and the parasitic capacitance is represented as the capacitors $C_p$ in FIG. 5B.

Similar to the example of FIG. 5A, the first matching network element 211 is configured to be electrically coupled to the Z1 stage and the second element 212 is configured to be electrically coupled to its immediate subsequent stage, i.e. the Z0 stage.

Similar to the example of FIG. 5A, a capacitor $C_m$ may be provided between the bottom section 512 and the top section 511. The capacitor $C_m$ may be provided on a voltage node for an ideal wanted mode of operation. Unwanted lower frequency modes can be moved to lower frequency by the capacitor $C_m$. Thus, a better frequency separation between wanted and unwanted modes can be achieved for improving the amplitude and phase uniformity of the wanted mode.

The first matching network element 211 may comprise a series capacitor $C_t$ comprising a first terminal electrically connected to the stage Z1, and a second terminal electrically connected to the second matching network element 212, and a shunt inductor $L_t$ comprising a first terminal connected to the first terminal of the series capacitor $C_t$, and a second terminal electrically connected to a ground or virtual ground node.

The series capacitor $C_t$ and the shunt inductor $L_t$ of the first matching network element 211 may be considered as a high-pass network.

The second matching network element 212 may comprise a series inductor $L_b$ comprising a first terminal electrically connected to the second terminal of the series capacitor $C_t$, and a second terminal electrically connected to the stage Z0, and a shunt capacitor $C_p$ comprising a first terminal connected to the second terminal of the series inductor $L_b$, and a second terminal electrically connected to the ground or virtual ground node.

The series inductor L; and the shunt capacitor $C_b$ of the second matching network element 212 may be considered as a resonant low-pass network at a resonance frequency $\omega_r$, wherein $$\omega_r^2 L_b C_b = 1.$$

The impedance transformation of the two-port network 21 can be calculated as the voltage ratio $$\left|\frac{V_t}{V_b}\right|.$$

This ratio is equal to $$\frac{1}{\omega_r^2 C_t L_b}.$$

Thus, the parasitic Capacitance $C_p$ of the Z1 stage will no longer limit the voltage ratio.

Inclusion of the first matching network element 211 allows for a better compensation for parasitic capacitance $C_p$ of the stage Z1 that it connects to. Consequently, with the two-port network 21, the multistage feed network 2 can achieve a higher voltage transformation. Further, it is possible to extend the number of tiles 1 as $C_p$ is proportional to the number of tiles 1.

In connection with FIG. 6, a superconducting system comprising a phase generator 3 will be discussed in detail.

The phase generator 3 comprises a ring structure for generating multiple phase signals for feeding a superconducting circuit (not shown).

The phase generator 3 is configured to electrically connect to an AC voltage source $V_s$ such that a current flows through the ring structure in one direction.

The AC voltage source $V_s$ may be electrically coupled to the ring structure via a coupling resistor $R_s$.

The AC voltage source $V_s$ may be the same as the one the first stage electrically connected to for receiving the first incoming signal.

Alternatively, the AC voltage source $V_s$ may be different from the one the first stage electrically connected to for receiving the first incoming signal.

Figure 6:
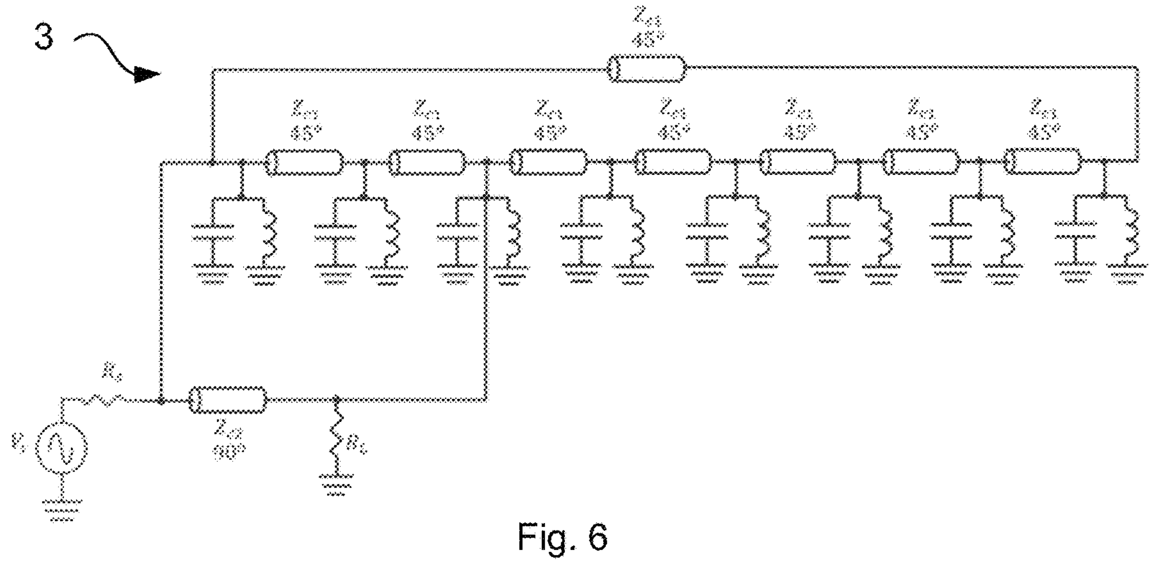
FIG. 6 is a schematic diagram of an example phase generator.

For example, in FIG. 6, a single feed line, represented as a transmission line $Z_{c2}$ having a length of a quarter wavelength (λ/4), is used for feeding the phase generator 3.

There are many other options to feed the phase generator 3, such as to feed the phase generator 3 by two quadrature signals (same amplitude, 90 degrees out-of-phase).

The ring structure comprises a number M transmission line elements configured to electrically connect in series, each having a length of an integer multiple of one Mth wavelength (λ/M). A number M different phase signals are configured to output between two adjacent transmission line elements of the number M transmission lines, respectively. M is an integer, and M≥2.

If M equals to 8, as shown in FIG. 6, the ring structure comprises eight transmission lines $Z_{c1}$ configured to be electrically coupled in series, each having a length one eighth wavelength (λ/8). Eight different phase signals (e.g., 0°, 45°, 90°, 135°, . . . ) may be configured to output between two adjacent transmission lines $Z_{c1}$, respectively.

The length of each transmission lines $Z_{c1}$ may be an integer multiple of one eighth wavelength, such as one quarter or one-half wavelength. That is, a length of the ring structure (a total length of all the M transmission lines) may be an integer multiple of one wavelength (λ).

The superconducting system comprises a number M multistage feed networks 2 (not shown), each for feeding one of the number M different phase signals to the superconducting circuit (the tiles 1).

The parallel LC networks provided between two adjacent transmission lines $Z_{c1}$ in FIG. 6 represent an equivalent input impedance of the power/clock network for each of the phase signals.

The geometry of the ring structure guarantees a generation of perfect multiphase signals at the resonance frequency of the ring structure. This topology has a very low phase error between the different phase signals due to the geometric structure of the ring structure when it is on resonance, corresponding to an integer multiple of a full wavelength over a length of ring structure.

The transmission lines $Z_{c1}$ of the ring structure may be implemented by lumped LC pi-networks, e.g., by using integrated tile inductors and tunable bias capacitors available in the superconducting circuit fabrication stack. With the tunable capacitors, the resonance frequency of the ring structure and the feed line $Z_{c2}$ (λ/4) can be adjusted to the frequency of the networks (e.g., power/clock networks) that it feeds. Multiple of such phase generators 3 may be provided in the superconducting circuit 100 for stabilizing the networks that they feed.

This is advantageous as the different phase signals may be generated internally on-chip instead of using external phase signals, such that an improved control of the phase signals can be achieved. Further, the properties of the phase signals, e.g., amplitude uniformity, can be improved.

The superconducting system may comprise the superconducting circuit comprising a plurality of tiles 1, each comprising at least one resonant circuit comprising: an inductor 11 comprising a first terminal and a second terminal, and at least one capacitor 12 comprising a first terminal electrically connected to the second terminal of the inductor; and at least one Josephson junction 13 comprising a first terminal electrically connected to a second terminal of the at least one capacitor and a second terminal electrically connected to a ground or virtual ground node.

The number M multistage feed networks 2 may be configured to feed the number M different phase signals to the terminal shared by the inductor 11 and the at least one capacitor 12, respectively.

Similar to the method of FIG. 7, a method for fabricating the superconducting system comprising the superconducting circuit and the phase generator 3, comprises: forming, in first layers of a fabrication stack, the number M multistage feed networks 2, the phase generator 3, and the plurality of tiles 1 except for the at least one Josephson junction 13; and forming, in second layers of the fabrication stack, the at least one Josephson junction 13.

This is advantageous as the multistage feed networks 2 and the phase generator 3 may be formed in the same layers of the fabrication stack for forming the tiles 1 except for Josephson junctions 13.

The step of forming, in first layers of a fabrication stack, the number M multistage feed networks 2, the phase generator 3, and the plurality of tiles 1 except for the at least one Josephson junction 13 may comprise:

forming, in the first layers of the fabrication stack, the plurality of tiles 1 each comprising at least one resonant circuit comprising an inductor 11 and at least one capacitor 12, wherein the inductor 11 comprising a first terminal 11A and a second terminal 11B, and the at least one capacitor 12 comprising a first terminal 12A electrically connected to the second terminal 11B of the inductor 11.

The at least one Josephson junction 13 may comprise a first terminal 13A electrically connected to a second terminal 12B of the at least one capacitor 12 and a second terminal 13B electrically connected to a ground or virtual ground node.

The step forming, in first layers of a fabrication stack, the number M multistage feed networks 2, the phase generator 3, and the plurality of tiles 1 except for the at least one Josephson junction 13 may comprise: forming at least two stages of the multistage feed network 2 by interleaving two metal layers of the first layers.

The features of the fabrication stack comprising layers for forming the superconducting system discussed in connection to FIG. 7 are analogously applicable to this fabrication stack.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A multistage feed network for distributing a signal for feeding a superconducting circuit, wherein the multistage feed network comprises:

a number N stages being a first stage, one or more intermediate stages, and an Nth stage, arranged in a sequential order; and a plurality of two-port networks, each configured to electrically connect to two adjacent stages in between, wherein the first stage is configured to electrically connect to a signal source for receiving a first incoming signal, and to distribute the first incoming signal to a plurality of first outgoing signals, and wherein the Nth stage is configured to receive a plurality of Nth incoming signals, and to distribute each of the plurality of Nth incoming signals to a plurality of Nth outgoing signals, wherein for each stage, except for the Nth stage, each of the plurality (pluralities) of outgoing signals of said stage is configured to be electrically coupled to one of the plurality of incoming signals of its immediate subsequent stage by one of the plurality of two-port networks, wherein said one of the plurality of two-port networks is configured to perform impedance matching between said stage and its immediate subsequent stage;

wherein the pluralities of Nth outgoing signals are configured to be fed to the superconducting circuit, wherein at least one stage of the number N stages comprises a mesh network made of interconnected superconducting wires such that the incoming signal(s) of said stage is configured to be distributed to the outgoing signals of said stage by said mesh network with a minimal deviation of signal amplitude and of signal phase, wherein the signal source is an Alternating Current, AC, voltage source, wherein the first incoming signal is a power/clock combined signal, wherein N is an integer, and $N \geq 2$, wherein the Nth stage comprises a bottom mesh network made of interconnected superconducting wires configured to feed the pluralities of Nth outgoing signals to the superconducting circuit, wherein the bottom mesh network comprises multiple mesh network partitions split by one or more capacitors, and wherein at least one of the one or more capacitors is connected in series between every two adjacent mesh network partitions for splitting the bottom mesh network.

2. The multistage feed network according to claim 1, wherein said one of the plurality of two-port networks comprises at least one transmission line element having a length of one-half wavelength ($\lambda/2$), wherein the at least one transmission line element comprises a single transmission line having a length of one-half wavelength ($\lambda/2$), or two transmission lines connected in series each having a length of one quarter wavelength ($\lambda/4$), and wherein the wavelength ($\lambda$) is the wavelength of a signal transmitted through the transmission line(s).

3. The multistage feed network according to claim 2, wherein the at least one transmission line element is implemented as a lumped element network comprising at least one inductor and at least one capacitor.

4. The multistage feed network according to claim 1, wherein a capacitance of the at least one of the one or more capacitors is selected to cause a resonance with inductors of said two adjacent mesh network partitions.

5. The multistage feed network according to claim 1, wherein the first stage comprises a top mesh network made of interconnected superconducting wires configured to electrically connect to multiple nodes for feeding the plurality of first outgoing signals to the second stage, wherein the first stage comprises a transmission line element having a length of an integer multiple of one wavelength ($\lambda$) and being connected between any two electrically connected adjacent nodes of the multiple nodes, and wherein the wavelength ($\lambda$) is the wavelength of a signal transmitted through the transmission line element.

6. The multistage feed network according to claim 1, wherein any stage of the number N stages, except for the first and the Nth stage, comprises a mesh network made of interconnected superconducting wires configured to feed the pluralities of the outgoing signals of said stage to its immediate subsequent stage, wherein said mesh network comprises multiple mesh network partitions split by one or more capacitors, and
wherein at least one of the one or more capacitors is connected in series between every two adjacent mesh network partitions for splitting said mesh network.

7. The multistage feed network according to claim 6, wherein a capacitance of the at least one of the one or more capacitors is selected to cause a resonance with inductors of said two adjacent mesh network partitions.

8. The multistage feed network according to claim 1,
wherein any stage of the number N stages, except for the first and the Nth stage, comprises a mesh network made of interconnected superconducting wires configured to electrically connect to multiple nodes for feeding the pluralities of the outgoing signals of said stage to its immediate subsequent stage,
wherein said stage comprises a transmission line element having a length of an integer multiple of one wavelength (λ) and being connected between any two electrically connected adjacent nodes of the multiple nodes, and
wherein the wavelength (λ) is the wavelength of a signal transmitted through the transmission line element.

9. The multistage feed network according to claim 1,
wherein said one of the plurality of two-port network comprises a first matching network element and a second matching network element electrically connected in series between said stage and its immediate subsequent stage,
wherein the first matching network element comprises:
a series capacitor comprising a first terminal electrically connected to said stage, and a second terminal electrically connected to the second matching network element; and
a shunt inductor comprising a first terminal connected to the first terminal of the series capacitor, and a second terminal electrically connected to a ground or virtual ground node,
wherein the second matching network element comprises:
a series inductor comprising a first terminal electrically connected to the second terminal of the series capacitor, and a second terminal electrically connected to said immediate subsequent stage; and
a shunt capacitor comprising a first terminal connected to the second terminal of the series inductor, and a second terminal electrically connected to the ground or virtual ground node.

10. A superconducting system, comprising:
a superconducting circuit comprising a plurality of tiles, wherein each of the plurality of tiles comprises:
at least one resonant circuit comprising:
an inductor comprising a first terminal and a second terminal; and
at least one capacitor comprising a first terminal electrically connected to the second terminal of the inductor; and
at least one Josephson junction comprising a first terminal electrically connected to a second terminal of the at least one capacitor and a second terminal electrically connected to a ground or virtual ground node; and
the multistage feed network according to claim 1 configured to feed an outgoing signal of the pluralities of Nth outgoing signals to the terminal shared by the inductor and the at least one capacitor.

11. The superconducting system according to claim 10,
wherein an inductance of the inductor and a capacitance of the at least one capacitor are selected to cause the at least one resonant circuit to resonate at a frequency that substantially matches a particular frequency of said outgoing signal to facilitate switching a state of the at least one Josephson junction via a single flux quantum, SFQ, pulse.

12. A superconducting system, comprising a phase generator of a ring structure for generating multiple phase signals for feeding a superconducting circuit,
wherein the phase generator is configured to electrically connect to an AC voltage source such that a current flows through the ring structure in one direction,
wherein the ring structure comprises:
a number M transmission line elements configured to electrically connect in series, each having a length of an integer multiple of one Mth wavelength (λ/M),
wherein a number M different phase signals are configured to output between two adjacent transmission line elements of the number M transmission lines, respectively,
wherein the superconducting system comprises a number M multistage feed networks according to claim 1, each for feeding one of the number M different phase signals to the superconducting circuit,
wherein the wavelength (λ) is the wavelength of a signal transmitted through the transmission line elements, and
wherein M is an integer, and M≥2.

13. The superconducting system according to claim 12, wherein at least one of the number M transmission line elements is implemented as a lumped element network comprising at least one inductor and at least one capacitor.

14. The superconducting system according to claim 12, comprising the superconducting circuit,
wherein the superconducting circuit comprises a plurality of tiles, each comprising:
at least one resonant circuit comprising:
an inductor comprising a first terminal and a second terminal; and
at least one capacitor comprising a first terminal electrically connected to the second terminal of the inductor; and
at least one Josephson junction comprising a first terminal electrically connected to a second terminal of the at least one capacitor and a second terminal electrically connected to a ground or virtual ground node,
where the number M multistage feed networks are configured to feed the number M different phase signals to the terminal shared by the inductor and the at least one capacitor, respectively.

15. A method for fabricating a superconducting system, wherein the superconducting system comprises:
a superconducting circuit comprising a plurality of tiles, each comprising at least one Josephson junction; and
a phase generator comprising a ring structure for generating multiple phase signals for feeding the superconducting circuit,
wherein the phase generator is configured to electrically connect to an AC voltage source such that a current flows through the ring structure in one direction,
wherein the ring structure comprises:
a number M transmission line elements configured to electrically connect in series, each having a length of an integer multiple of one Mth wavelength (λ/M), wherein a number M different phase signals are configured to output between two adjacent transmission line elements of the number M transmission lines, respectively, wherein the superconducting system comprises a number M multistage feed networks according to claim 1, each for feeding one of the number M different phase signals to the superconducting circuit, wherein the wavelength (λ) is the wavelength of a signal transmitted through the transmission line elements, wherein M is an integer, and M≥2, the method comprising:

forming, in first layers of a fabrication stack, the number M multistage feed networks, the phase generator, and the plurality of tiles except for the at least one Josephson junction; and forming, in second layers of the fabrication stack, the at least one Josephson junction.

16. A method for fabricating a superconducting system, wherein the superconducting system comprises:

a superconducting circuit comprising a plurality of tiles, each comprising at least one Josephson junction; and a multistage feed network for distributing a signal for feeding the superconducting circuit, wherein the multistage feed network comprises a number N stages being a first stage, one or more intermediate stages, and an Nth stage, arranged in a sequential order, and a plurality of two-port networks, each configured to electrically connect to two adjacent stages in between, the method comprising:

1) forming, in first layers of a fabrication stack, the multistage feed network and the plurality of tiles except for the at least one Josephson junction; and 2) forming, in second layers of the fabrication stack, the at least one Josephson junction, wherein the first stage is configured to electrically connect to a signal source for receiving a first incoming signal, and to distribute the first incoming signal to a plurality of first outgoing signals, and wherein the Nth stage is configured to receive a plurality of Nth incoming signals, and to distribute each of the plurality of Nth incoming signals to a plurality of Nth outgoing signals, wherein for each stage, except for the Nth stage, each of the plurality (pluralities) of outgoing signals of said stage is configured to be electrically coupled to one of the plurality of incoming signals of its immediate subsequent stage by one of the plurality of two-port networks, wherein said one of the plurality of two-port networks is configured to perform impedance matching between said stage and its immediate subsequent stage, wherein the pluralities of Nth outgoing signals are configured to be fed to the superconducting circuit, wherein at least one stage of the number N stages comprises a mesh network made of interconnected superconducting wires such that the incoming signal(s) of said stage is configured to be distributed to the outgoing signals of said stage by said mesh network with a minimal deviation of signal amplitude and of signal phase, wherein the signal source is an Alternating Current, AC, voltage source, wherein the first incoming signal is a power/clock combined signa, wherein N is an integer, and N≥2, wherein the Nth stage comprises a bottom mesh network made of interconnected superconducting wires configured to feed the pluralities of Nth outgoing signals to the superconducting circuit, wherein the bottom mesh network comprises multiple mesh network partitions split by one or more capacitors, and wherein at least one of the one or more capacitors is connected in series between every two adjacent mesh network partitions for splitting the bottom mesh network.

17. The method for fabricating the superconducting system according to claim 16, wherein the step of 1) forming, in first layers of the fabrication stack, the multistage feed network and the plurality of tiles except for the at least one Josephson junction comprises:

forming, in the first layers of the fabrication stack, the plurality of tiles each comprising at least one resonant circuit comprising an inductor and at least one capacitor, wherein the inductor comprising a first terminal and a second terminal, and the at least one capacitor comprising a first terminal electrically connected to the second terminal of the inductor, wherein the at least one Josephson junction comprises a first terminal electrically connected to a second terminal of the at least one capacitor and a second terminal electrically connected to a ground or virtual ground node.

18. The method for fabricating the superconducting circuit according to claim 16, wherein the step of 1) forming, in first layers of the fabrication stack, the multistage feed network and the plurality of tiles except for the at least one Josephson junction comprises:

forming at least two stages of the multistage feed network by interleaving two metal layers of the first layers.

19. A multistage feed network for distributing a signal for feeding a superconducting circuit, wherein the multistage feed network comprises:

a number N stages being a first stage, one or more intermediate stages, and an Nth stage, arranged in a sequential order; and a plurality of two-port networks, each configured to electrically connect to two adjacent stages in between, wherein the first stage is configured to electrically connect to a signal source for receiving a first incoming signal, and to distribute the first incoming signal to a plurality of first outgoing signals, and wherein the Nth stage is configured to receive a plurality of Nth incoming signals, and to distribute each of the plurality of Nth incoming signals to a plurality of Nth outgoing signals, wherein for each stage, except for the Nth stage, each of the plurality (pluralities) of outgoing signals of said stage is configured to be electrically coupled to one of the plurality of incoming signals of its immediate subsequent stage by one of the plurality of two-port networks, wherein said one of the plurality of two-port networks is configured to perform impedance matching between said stage and its immediate subsequent stage;

wherein the pluralities of Nth outgoing signals are configured to be fed to the superconducting circuit, wherein at least one stage of the number N stages comprises a mesh network made of interconnected superconducting wires such that the incoming signal(s) of said stage is configured to be distributed to the outgoing signals of said stage by said mesh network with a minimal deviation of signal amplitude and of signal phase, wherein the signal source is an Alternating Current, AC, voltage source, wherein the first incoming signal is a power/clock combined signal, wherein N is an integer, and N≥2, wherein any stage of the number N stages, except for the first and the Nth stage, comprises a mesh network made of interconnected superconducting wires configured to electrically connect to multiple nodes for feeding the pluralities of the outgoing signals of said stage to its immediate subsequent stage, wherein said stage comprises a transmission line element having a length of an integer multiple of one wavelength (λ) and being connected between any two electrically connected adjacent nodes of the multiple nodes, and wherein the wavelength (λ) is the wavelength of a signal transmitted through the transmission line element.

* * * * *